United States Patent
Ruderer et al.

(10) Patent No.: US 7,458,053 B2
(45) Date of Patent: Nov. 25, 2008

(54) METHOD FOR GENERATING FILL AND CHEESE STRUCTURES

(75) Inventors: Erwin Ruderer, Markt Schwaben (DE); Walther Lutz, Erding (DE); Bernhard Dobler, Erding (DE)

(73) Assignee: Infineon Technologies AG, Munich (DE)

( * ) Notice: Subject to any disclaimer, the term of this patent is extended or adjusted under 35 U.S.C. 154(b) by 295 days.

(21) Appl. No.: 11/504,951

(22) Filed: Aug. 16, 2006

(65) Prior Publication Data

US 2008/0046853 A1  Feb. 21, 2008

(51) Int. Cl.
    *G06F 17/50* (2006.01)
(52) U.S. Cl. .................. 716/10; 716/2; 716/13
(58) Field of Classification Search ............... None
    See application file for complete search history.

(56) References Cited

U.S. PATENT DOCUMENTS

| | | | |
|---|---|---|---|
| 5,636,133 A | 6/1997 | Chesebro et al. | 364/491 |
| 5,923,563 A | 7/1999 | Lavin et al. | 364/488 |
| 6,223,331 B1 | 4/2001 | Juengling | 716/10 |
| 6,434,732 B2 | 8/2002 | Juengling | 716/10 |
| 6,499,135 B1 | 12/2002 | Li et al. | 716/19 |
| 6,507,930 B1 | 1/2003 | Bass, Jr. et al. | 716/2 |
| 6,637,013 B1 | 10/2003 | Li | 716/5 |
| 7,231,624 B2 * | 6/2007 | Vuong et al. | 716/12 |
| 7,269,807 B2 * | 9/2007 | Shimada et al. | 716/5 |
| 7,328,419 B2 * | 2/2008 | Vuong et al. | 716/11 |
| 2002/0185664 A1 | 12/2002 | Dixit et al. | 257/211 |
| 2004/0255259 A1 | 12/2004 | Tan et al. | 716/11 |

OTHER PUBLICATIONS

Laura Peters, "DFM: Worlds Collide, Then Cooperate", Jun. 1, 2005, Semiconductor International Jun. 1, 2005, available at http://www.reed-electronics.com/semiconductor/index.asp?layout=articlePrint&articleID=CA604505, 11 pages.

(Continued)

*Primary Examiner*—Leigh Marie Garbowski
(74) *Attorney, Agent, or Firm*—Davidson, Davidson & Kappel, LLC

(57) ABSTRACT

A multi-pass method for designing at least a portion of a circuit layout on a substrate is provided which includes receiving or generating a first level frame including an electrical component; generating a fill pattern on the first level frame outside of a forbidden area of said first level frame; generating a next level frame, the next level frame including the first level frame and a next level fill area outside of the first level frame; and adding a conductor to the next level frame. The conductor is connected to the electrical component, a first portion of the conductor is in the first level frame and a second portion of the conductor is in the next level fill area. The method includes generating a next fill pattern on the next level fill area outside of a forbidden area of said next level fill area, modifying the first level forbidden area to extend at least over the electrical component and the first portion of the conductor, and removing any of the plurality of structures in the fill pattern that are within the modified first level forbidden area.

13 Claims, 12 Drawing Sheets

OTHER PUBLICATIONS

Yu Chen et al., "Compressible Area Fill Synthesis", IEEE Transactions on Computer—Aided Design of Integrated Circuits And Systems, vol. 24, No. 8, Aug. 2005, pp. 1169-1187.

MentorGraphics, "Calibre DESIGNrev Datasheet", available at http://www.mentor.com/products/ic_nanometer_design/cl_floorplan/calibre_designrev/upload/DESIGNrev.pdf, 2 pages.

Mentor Graphics, "Calibre LFD Datasheet", available at http://www.mentor.com/products/ic_nanometer_design/b1_phy_design/calibre_1fd/upload/calibre_1fd.pdf, 3 pages.

Jacob Bakker, "Using Calibre in a Design for Manufacturability Environment", paper presented at the 2001 IC Design Technical Forum, available at http://www.mentor.com/dsm, 5 pages.

* cited by examiner

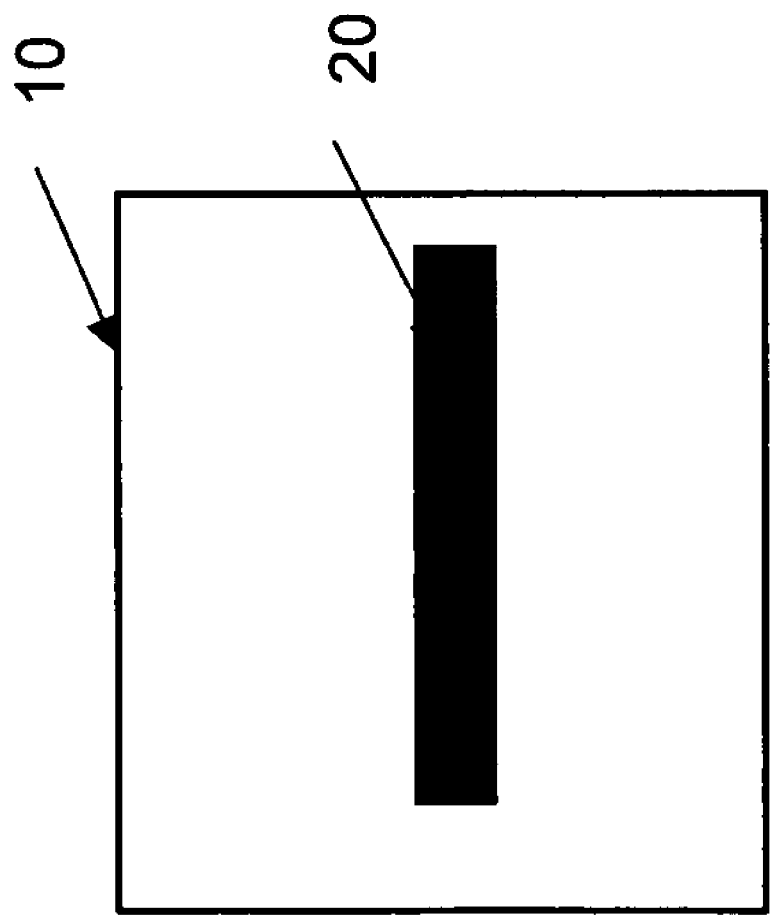

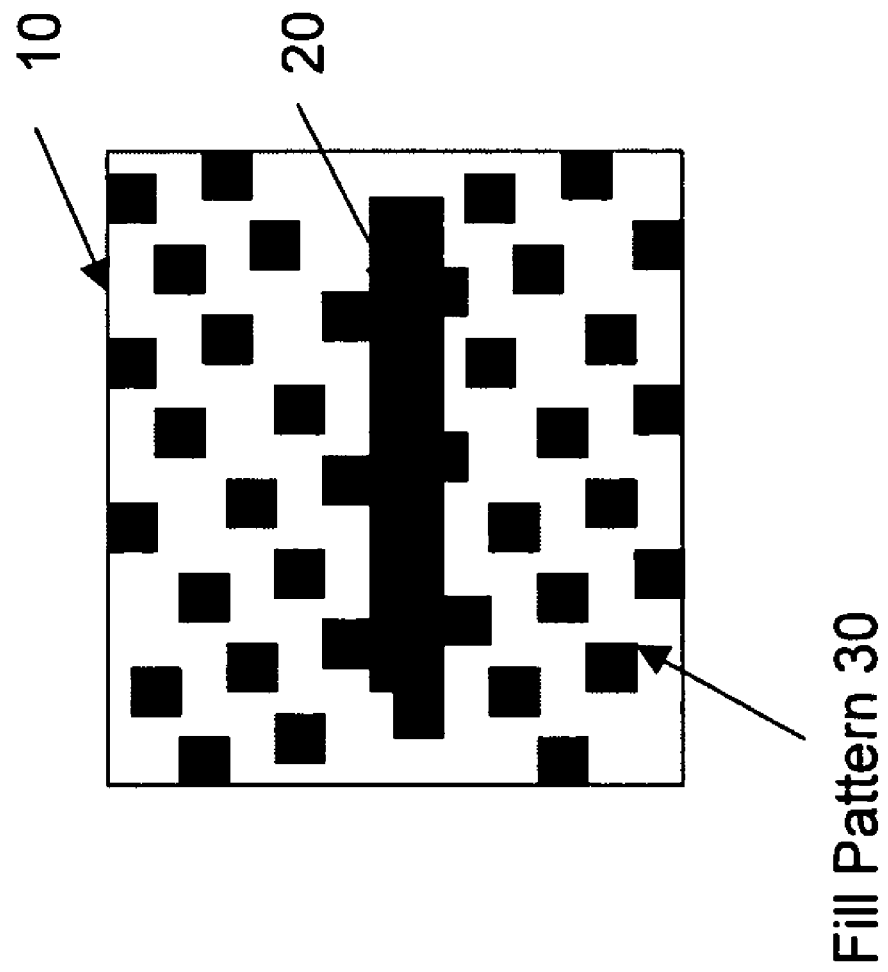

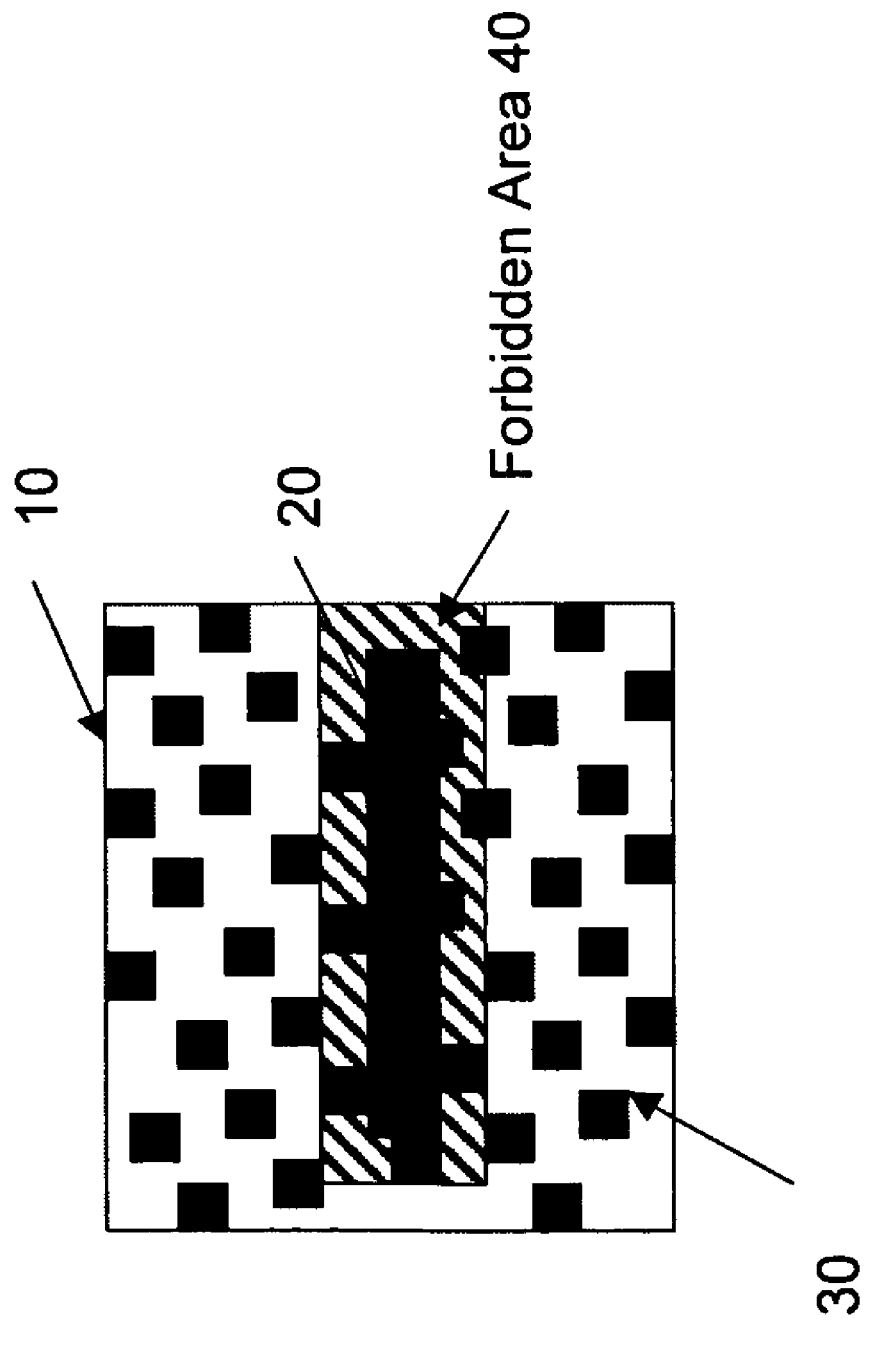

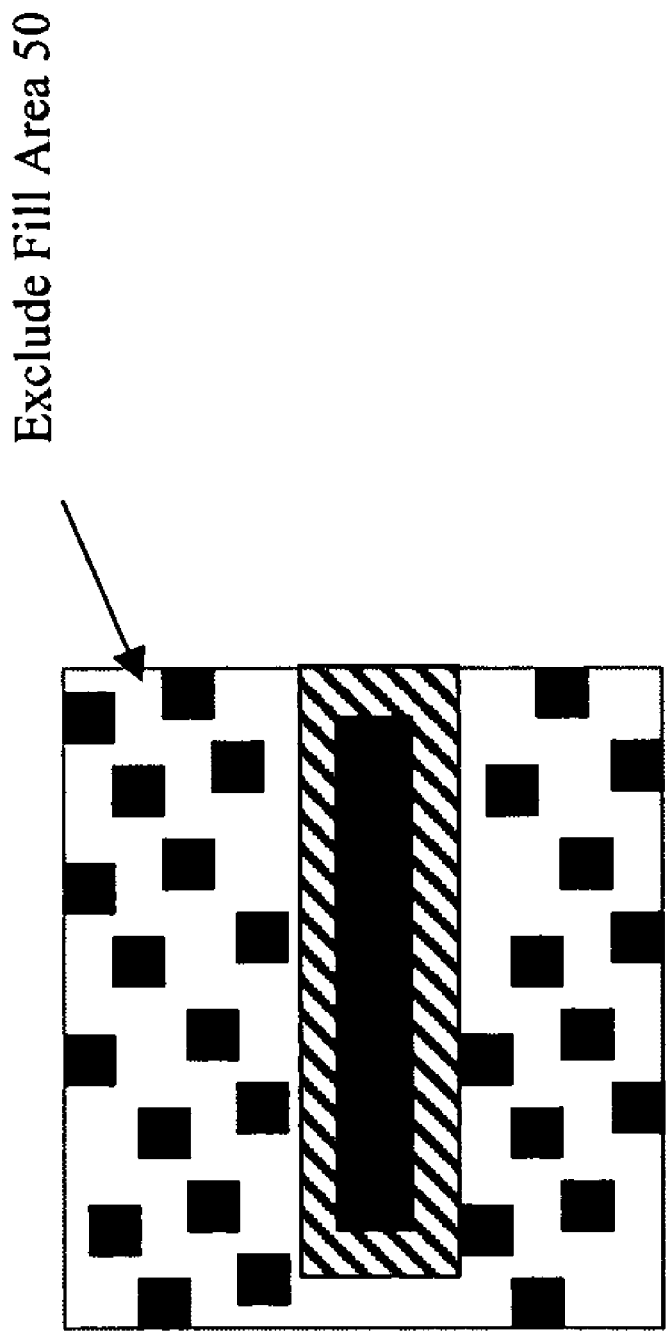

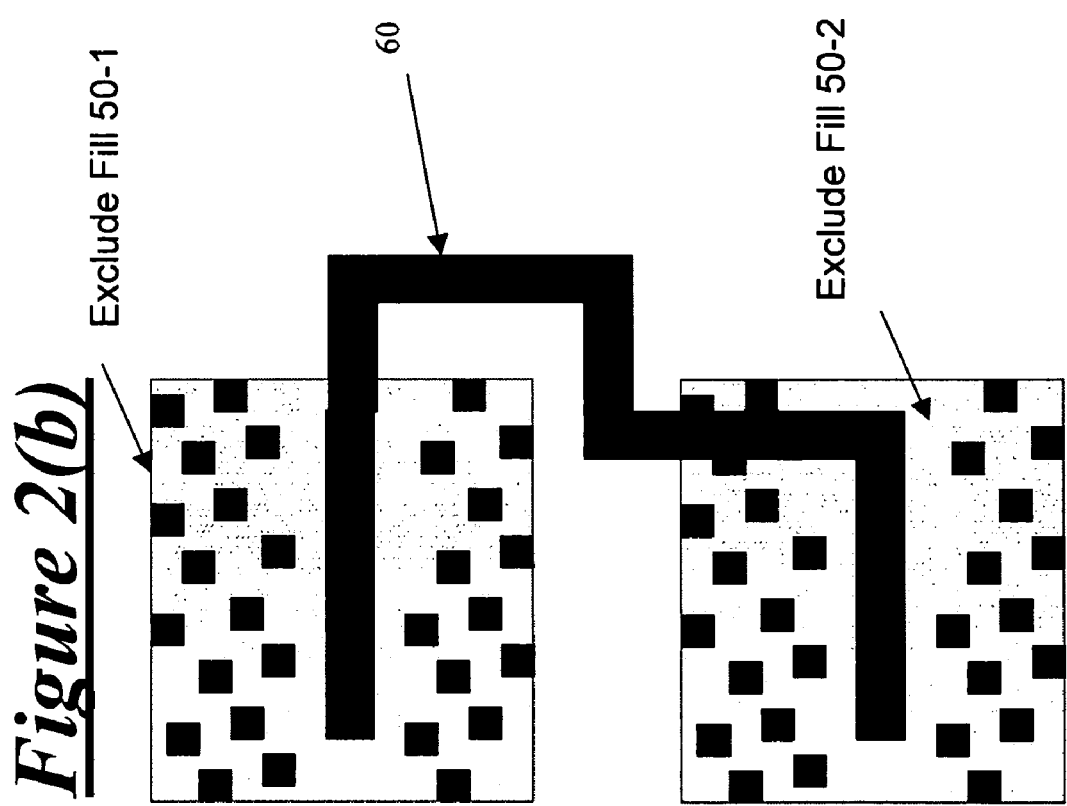

Level 2 Frame 100

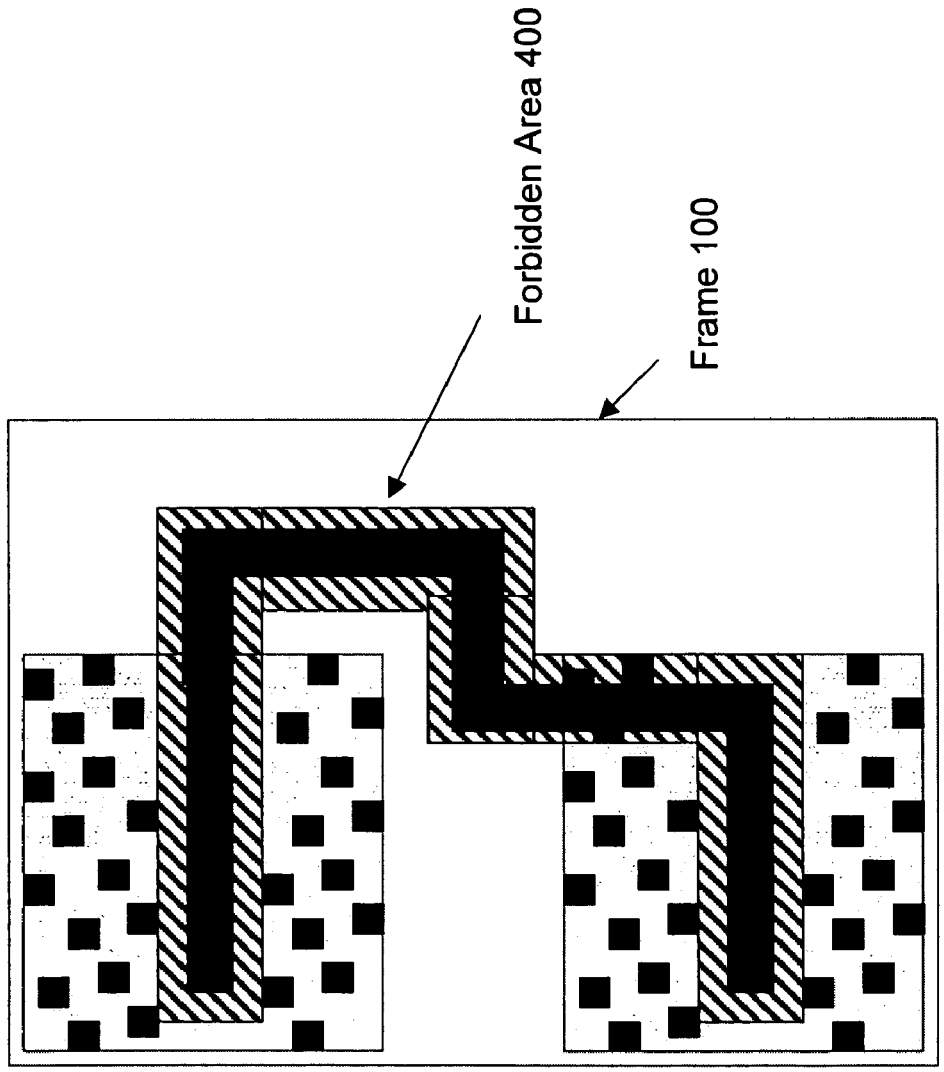

METHOD FOR GENERATING FILL AND CHEESE STRUCTURES

FIELD OF THE INVENTION

The present invention relates to the field of fill generating methods for integrated circuits, printed circuit boards and other substrates.

BACKGROUND OF THE INVENTION

Variations in layout pattern density can greatly affect the surface topography during Chemical-Mechanical Polishing (CMP). This in turn can cause yield loss due to the lithography and etching issues of non-flat surfaces.

It is known in the art to insert features that are electrically inactive ("fill structures") into a layout to increase layout pattern density or and to remove features from the layout ("cheese structures") to decrease layout pattern density.

BRIEF DESCRIPTION OF THE DRAWINGS

FIGS. 1(a) through 1(d) illustrate the process of adding fill and cheese structures to a level 1 frame.

FIGS. 3(a) through 3(e) illustrate the process of adding fill and cheese structures to the level N frame of FIG. 2(c).

DETAILED DESCRIPTION OF THE INVENTION

Figure 2A:
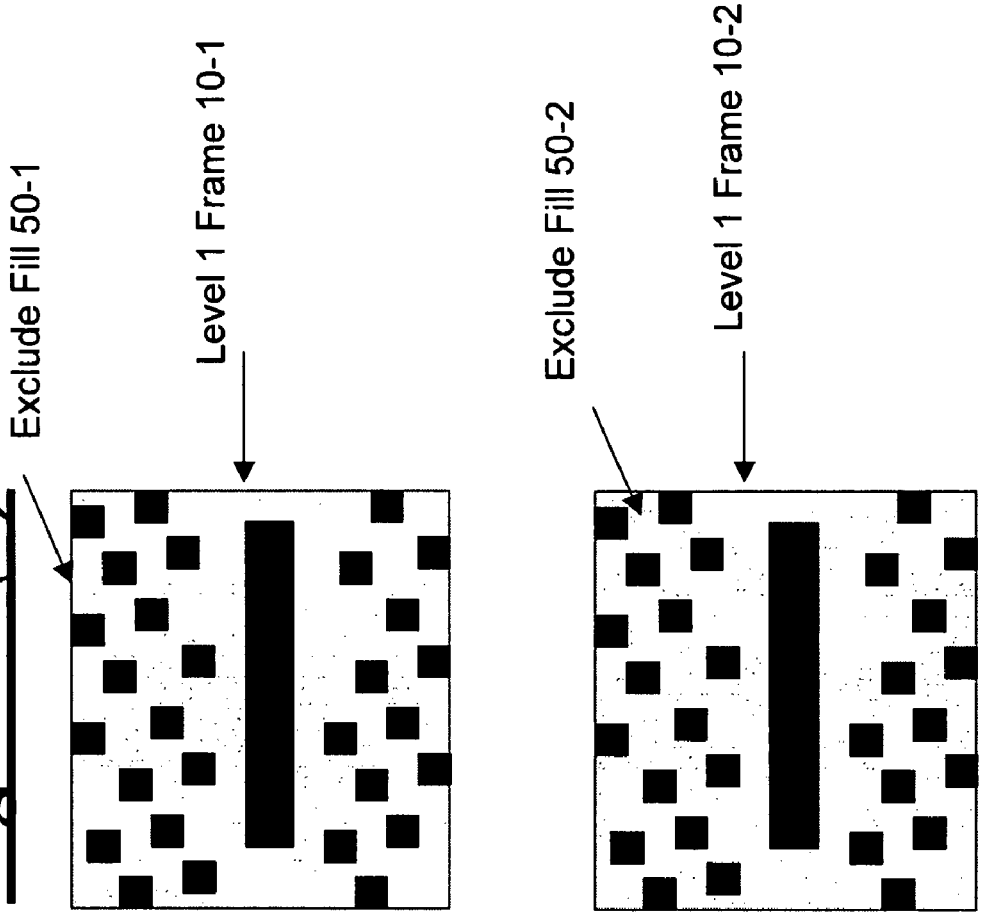
FIGS. 2 (a) through 2(c) illustrate a level N frame generated from a pair of level 1 frames.

Fill and cheese structures are conventionally created during "dataprep", just prior to generating the masks for the integrated circuits. As such, the existence, location, size, and shape of fill and cheese structures is not known to the circuit designer, and the effects of these structures on the circuit can not be precisely determined. Prior art methods assume a medium density of these structures and assume a uniform influence on the circuits. However, these assumptions become more and more inaccurate as the size of the circuit and of the structures decrease. Further, in the case of analog circuits, the location and form of the fill and cheese structures can have a particularly severe effect on circuit function.

It would therefore be desirable to allow the location of the fill and cheese structures to be designated by the circuit designer prior to dataprep.

In accordance with an embodiment of the present invention, a multi-pass method for designing at least a portion of a circuit layout on a substrate is provided. The substrate may, for example, be an integrated circuit, printed circuit board, multi-chip package, probe card or the like.

The method comprises receiving or generating a first level frame which includes an electrical component, and generating a fill pattern on the first level frame outside of a forbidden area of said first level frame ("first level forbidden area"). In this regard, the fill pattern includes a plurality of structures selected from the group consisting of fill structures, cheese structures and combinations thereof, and the first level forbidden area extends at least over the electrical component.

Preferably, an area of the electrical component is smaller than an area of the first level forbidden area. This provides spacing between the electrical component and the fill and/or cheese structures. Most preferably, the area of the first level forbidden area (and the other forbidden areas discussed below) are calculated based on minimum spacing requirements which are set by the user or system designer based on the particular design application.

In any event, the method includes generating a next level frame and adding a conductor to the first level frame. The next level frame includes the first level frame and a next level fill area outside of the first level frame. As explained above, the first level frame has the fill pattern. The conductor is connected to the electrical component, and a first portion of the conductor is in the first level frame and a second portion of the conductor is in the next level fill area.

In most cases, the next level frame will include a plurality of first level frames, previously received or generated as outlined above, and a plurality of conductors may be included in the next level frame for interconnecting the electrical components of the various first level frames.

The method additional includes generating a next fill pattern on the next level fill area outside of a forbidden area of said next level fill area ("next level forbidden area"), wherein the next fill pattern includes a plurality of structures selected from the group consisting of fill structures, cheese structures and combinations thereof, and wherein said next level forbidden area extends at least over the second portion of the conductor.

The first level forbidden area is modified to extend at least over the electrical component and the first portion of the conductor. The method then removes any of the plurality of structures in the fill pattern that are within the modified first level forbidden area.

In accordance with a further aspect of the above-referenced embodiment, the step of generating "fill pattern" described above further comprises identifying the first level forbidden area, applying an "interim fill pattern" on the first level frame, and removing any of the plurality of structures in the interim fill pattern that are within the first level forbidden area from the interim fill pattern to obtain the fill pattern.

Similarly, the step of generating a next fill pattern may further include the steps of identifying the next level forbidden area; applying an interim fill pattern on the next level fill area, and removing any of the plurality of structures in the interim fill pattern that are within the next level forbidden area from the interim fill pattern to obtain the next fill pattern.

Although the method has been described above with regard to a two pass process, the method can include additional passes as well. For example, to provide a third pass, the method described above may follow the following process.

A further next level frame is generated, where the further next level frame includes the next level frame and a further next level fill area outside of the next level frame. As noted above, the next level frame has the next fill pattern.

A further conductor is added to the further next level frame, where the further conductor is connected to one or more of the conductor and the electrical component. A first portion of the further conductor is in the next level frame and a second portion of the further conductor is in the further next level fill area.

A further next fill pattern is generated on the further next level fill area outside of a forbidden area of said further next level fill area ("further next level forbidden area"). The further next fill pattern includes a plurality of structures selected from the group consisting of fill structures, cheese structures and combinations thereof, and the further next level forbidden area extends at least over the second portion of the further conductor.

If the first portion of the further conductor is within the next level forbidden area, the method modifies the next level forbidden area to extend at least over the second portion of the conductor and the first portion of the further conductor, and removes any of the plurality of structures in the next fill pattern that are within the modified next level forbidden area.

If the first portion of the further conductor is within the first level forbidden area, the method further modifies the first level forbidden area to extend at least over the electrical component and the first portion of the conductor and the first portion of the further conductor and removes any of the plurality of structures in the fill pattern that are within the further modified first level forbidden area.

The methods according to the various embodiments of the present invention thus allow a circuit designer to generate fill and cheese structures during the circuit design process and prior to Dataprep.

As explained above, the process proceeds in an interative manner, with the user first generating fill and cheese structures for individuals portions (hereinafter referred to as level 1 frames) of a layout. The user then places the level 1 frames in a larger frame (referred to as level 2 frames), and adds any interconnections between these level 1 frames. The fill and cheese structures are then generated for the level 2 frame. In this regard, when generating the fill and cheese structures for the level 2 frame, the previously generated fill and cheese structures for the level 1 frames are reused, unless a design rule (or the user) dictates that it should be modified. For example, a design rule preferably removes fill and cheese structures that conflict with the added interconnections. The process outlined above can then be repeated for any number (N) of levels.

The process in accordance with the present invention is preferably implemented as a software design tool on a computer. As software design tools for generating layouts of integrated circuits and printed circuit boards, and inserting fill and cheese structures, are well known, the details of such software implementations are not relevant to this discussion and will need be repeated herein. Non-limiting examples of commercially available layout tools include Virtuoso, available from Cadence, Corp., CalibreDRC and CalibreHDRC, available from Mentor Graphics, Corp., among others.

The steps of the process will now be described graphically with reference to FIGS. 1 through 3.

FIGS. 1(a) through 1(d) illustrate the process of adding fill and cheese structures to a level 1 frame. Referring to FIG. 1(a), a level 1 frame 10 of a layout is shown with an electrical component or circuit element 20. The layout may be a layout of an integrated circuit, of a printed circuit board, or similar substrates.

In a first step, a fill pattern 30 is applied to the frame 10 (FIG. 1(b)). Then, a forbidden area 40 is identified in FIG. 1(c). It should be noted that the step of FIG. 1(c) could alternatively be performed before the step of FIG. 1(b).

The forbidden area 40 is an area including and surrounding the circuit element in which no fill or cheese structure can be inserted. In general, the size of the forbidden area 40 is determined based on the design rules for the particular design, such as minimum spacing requirements between circuit elements. The remainder of the frame 10 (i.e., the portion of the frame 10 which is outside the forbidden area) is then designated as the current fill area 30, as shown in FIG. 1(d). This frame 10 is then designated as an exclude fill area 50 and is saved for further processing. Manual modifications to the excluded fill area 50 can be entered and saved.

The process is then repeated for other circuit elements 20 in the layout.

Figure 2C:
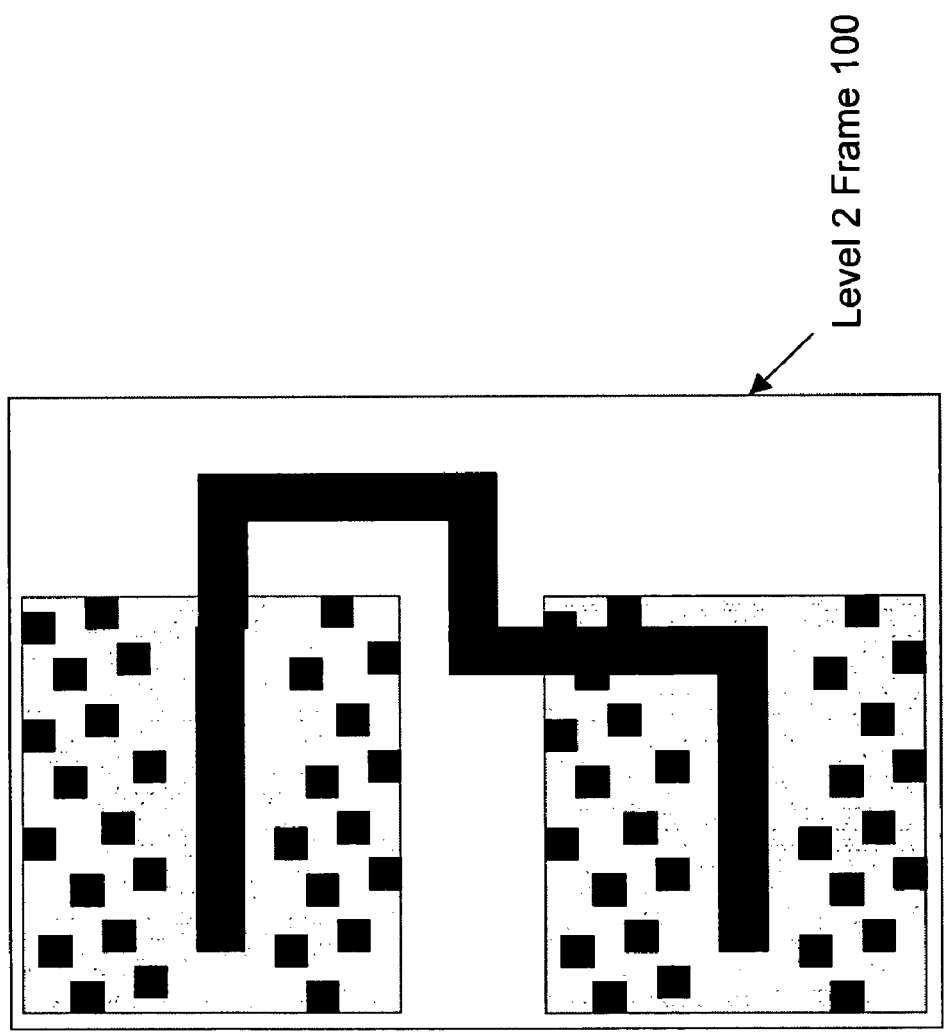

FIGS. 2(a) through 2(c) illustrate a level N frame generated from a pair of level 1 frames. FIG. 2(a) illustrates two level 1 frames 10-1 and 10-2, having respective exclude fill areas 50-1 and 50-2, which are placed on a layout. Any desired connections between the two frames, such as conductor 60, are added in a conventional manner as illustrated in FIG. 2(b) without regard to the location of the fills in the level 1 frames. A Level N frame, in this case Level 2 Frame 100 as N=2 in this example, is then defined by the user as illustrated in FIG. 2(c).

Figure 3B:
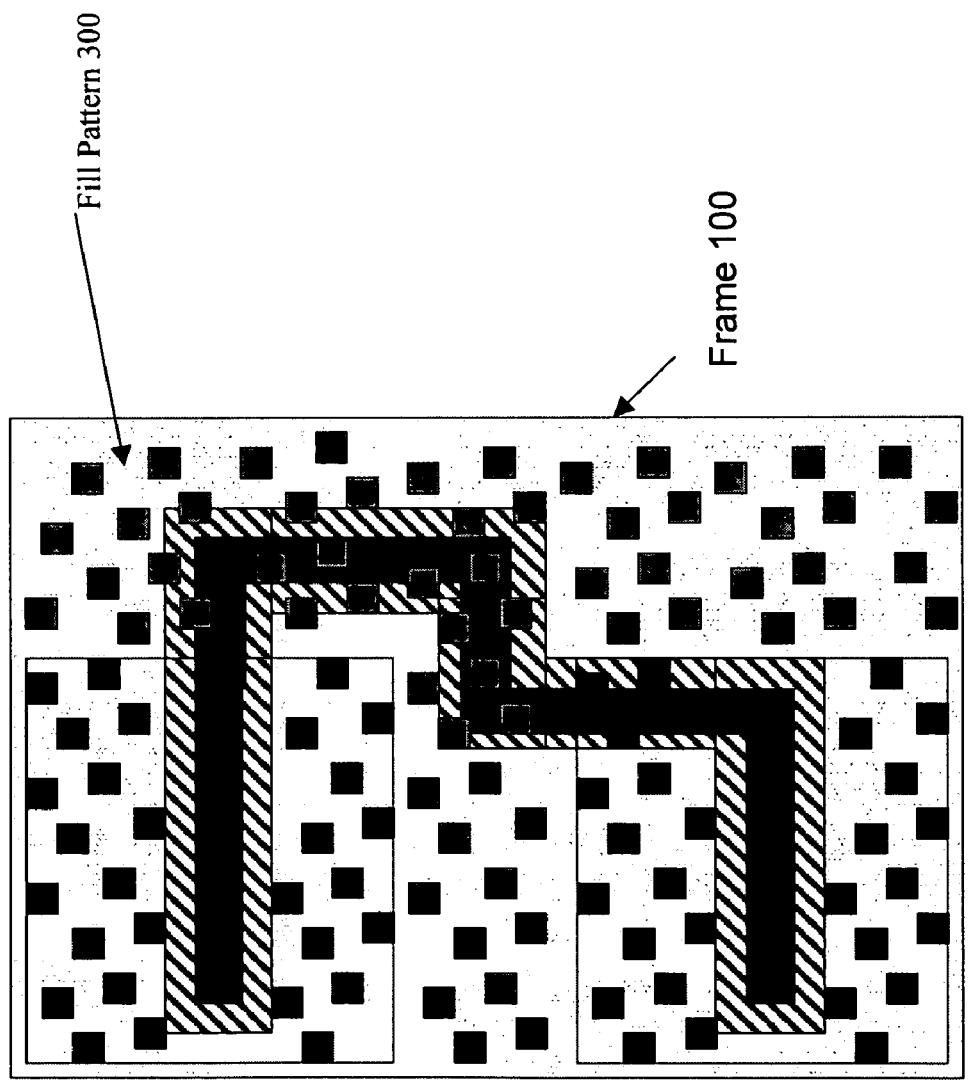
Figure 3C:
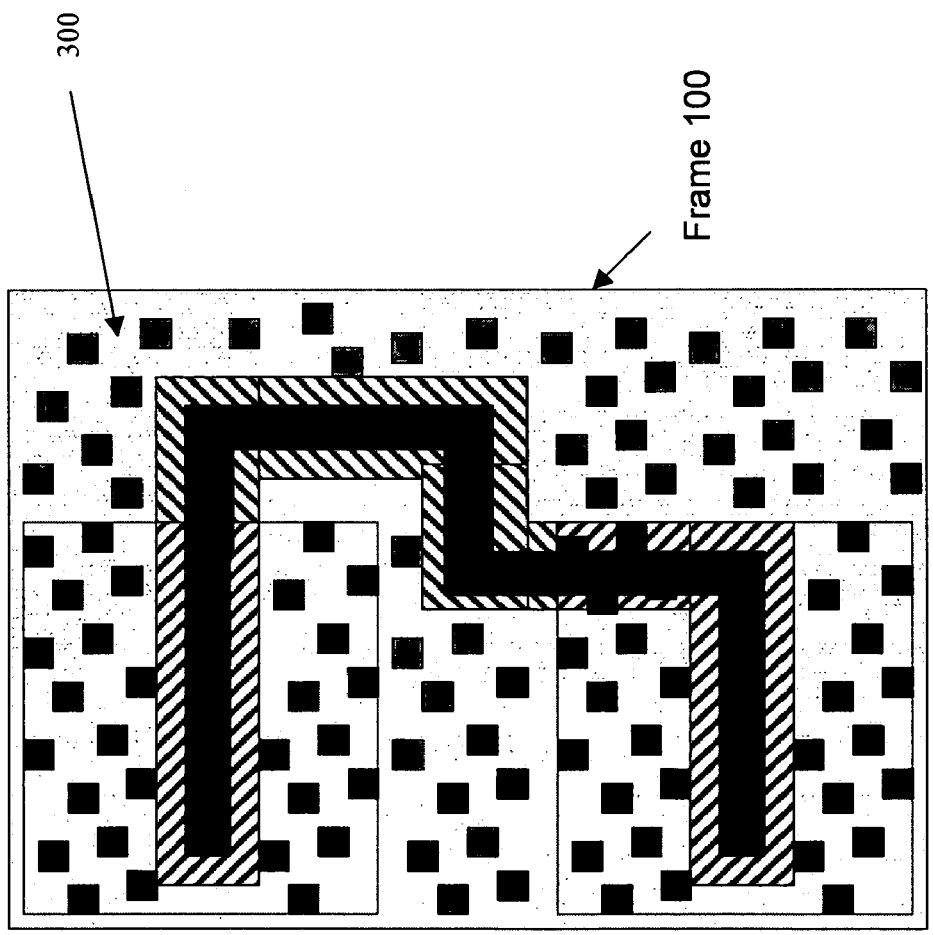
Figure 3D:
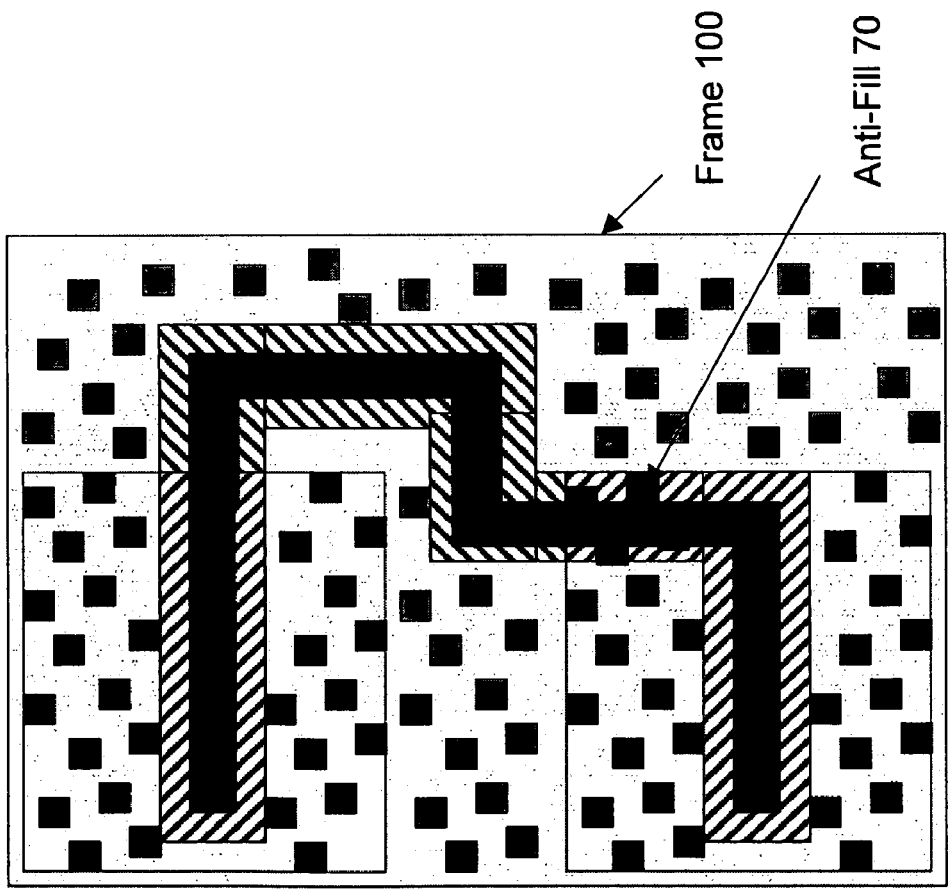
Figure 3E:
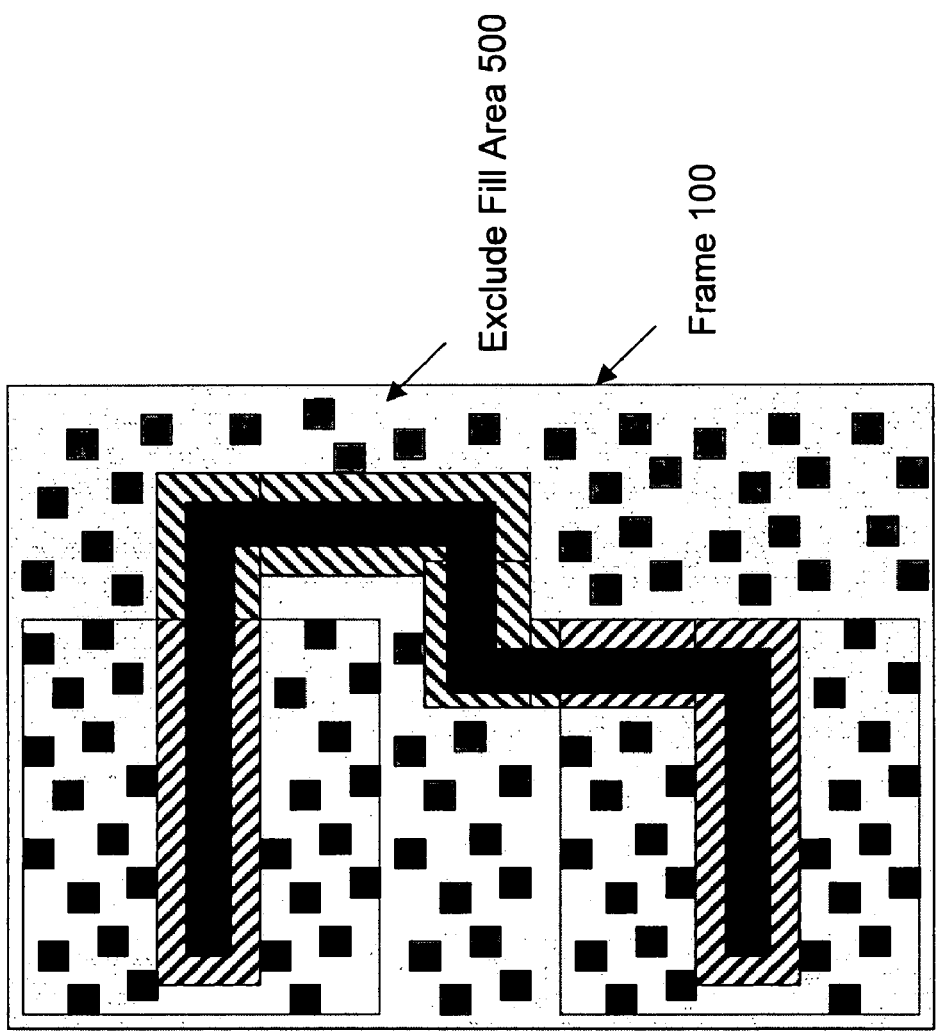

FIGS. 3(a) through 3(e) illustrate the process of adding fill and cheese structures to the level N frame of FIG. 2(c). In FIG. 3(a) a forbidden area 400 is generated for the conductor 60, and in FIG. 3(b) a fill pattern 300 is applied to the areas in frame 100 which are not part of frames 10-1 or 10-2. It should be noted that the step of FIG. 3(b) could alternatively be performed before the step of FIG. 3(a). In any event, the remainder of the frame 100 (i.e., the portion of the frame 100 which is outside the forbidden area 400 and outside of frames 10-1 and 10-2) is then designated as the current fill area 300, as shown in FIG. 3(c). As illustrated in FIG. 3(d) there is a portion of the exclude fill area 50-2 of frame 10-2, herein referred to as anti-fill area 70, that is now in a forbidden area, namely, forbidden area 400. In the step of FIG. 3(e), the fills in the anti-fill area 70 are removed. The frame 100 is then designated as an exclude fill area 500 and is saved for further processing. Manual modifications to the exclude fill area 500 can be entered and saved.

Frame 100 and exclude fill area 500 can then be used as components of a Level 3 frame in the same manner described above with regard to FIGS. 2 and 3.

In the description described above, the fill pattern 30 (FIGS. 1(b) and 3(b)) is applied as uniformly distributed fill structures. Although this is a simple and desirable pattern, it is also possible to implement more complex fill patterns. For example, the fill pattern 30 used may be dependent on characteristics of the layout, characteristics of the components 20, or other design constraints dictated by the user or overall system designer. Further, the fill pattern 30 can include a combination of fill and cheese structures. Moreover, as indicated above, the fill pattern can be manually modified by the user as well.

As explained above, the methods according to the embodiments of the present invention can be used by a circuit designer to designate the placement of fill and cheese structures in a design before dataprep. This provides the advantage of allowing the circuit designer to design the integrated circuit, printed circuit board, or other substrate with knowledge of the exact location of fill and cheese structures. The circuit designer can then perform simulations of the integrated circuit or other substrate which take into account the actual fill and cheese structures that will be used.

The methods according to the embodiments of the present invention can also be used for simulations in applications, such as semi-custom HW, where the fill and cheese structures are later generated during dataprep. In this regard, the methods described above can be used to run simulations of the integrated circuit, even though the actual fill and cheese structures which will be generated in dataprep may be somewhat different.

In the preceding specification, the invention has been described with reference to specific exemplary embodiments and examples thereof. It will, however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A multi-pass method for designing at least a portion of a circuit layout on a substrate, comprising:
   receiving or generating a first level frame including an electrical component;

generating a fill pattern on the first level frame outside of a forbidden area of said first level frame, the fill pattern including a plurality of structures selected from the group consisting of fill structures, cheese structures and combinations thereof, wherein said first level forbidden area extends at least over the electrical component;

generating a next level frame, the next level frame including the first level frame and a next level fill area outside of the first level frame, the first level framing having the fill pattern;

adding a conductor to the next level frame, the conductor connected to the electrical component, a first portion of the conductor being in the first level frame and a second portion of the conductor being in the next level fill area;

generating a next fill pattern on the next level fill area outside of a forbidden area of said next level fill area, the next fill pattern including a plurality of structures selected from the group consisting of fill structures, cheese structures and combinations thereof, wherein said next level forbidden area extends at least over the second portion of the conductor; and modifying the first level forbidden area to extend at least over the electrical component and the first portion of the conductor and removing any of the plurality of structures in the fill pattern that are within the modified first level forbidden area.

2. The method of claim 1, wherein an area of the electrical component is smaller than an area of the first level forbidden area.

3. The method of claim 2, wherein an area of the second portion is smaller than an area of the next level forbidden area.

4. The method of claim 3, wherein a combined area of the second portion and the electrical component is smaller than an area of the modified first level forbidden area.

5. The method of claim 1, wherein the step of generating a fill pattern comprises:
   identifying the first level forbidden area;
   applying an interim fill pattern on the first level frame, the interim fill pattern including a plurality of structures selected from the group consisting of fill structures, cheese structures and combinations thereof;
   removing any of the plurality of structures in the interim fill pattern that are within the first level forbidden area from the interim fill pattern to obtain the fill pattern.

6. The method of claim 5, wherein the identifying step is performed before the applying step.

7. The method of claim 5, wherein the identifying step is performed after the applying step and before the removing step.

8. The method of claim 1, wherein the step of generating a next fill pattern comprises:
   identifying the next level forbidden area;
   applying an interim fill pattern on the next level fill area, the interim fill pattern including a plurality of structures selected from the group consisting of fill structures, cheese structures and combinations thereof;
   removing any of the plurality of structures in the interim fill pattern that are within the next level forbidden area from the interim fill pattern to obtain the next fill pattern.

9. The method of claim 8, wherein the identifying step is performed before the applying step.

10. The method of claim 8, wherein the identifying step is performed after the applying step and before the removing step.

11. The method of claim 1, further comprising:
   generating a further next level frame, the further next level frame including the next level frame and a further next level fill area outside of the next level frame, the next level frame having the next fill pattern;
   adding a further conductor to the further next level frame, the further conductor connected to one or more of the conductor and the electrical component, a first portion of the further conductor being in the next level frame and a second portion of the further conductor being in the further next level fill area;
   generating a further next fill pattern on the further next level fill area outside of a forbidden area of said further next level fill area, the further next fill pattern including a plurality of structures selected from the group consisting of fill structures, cheese structures and combinations thereof, wherein said further next level forbidden area extends at least over the second portion of the further conductor;
   if the first portion of the further conductor is within the next level forbidden area, modifying the next level forbidden area to extend at least over the second portion of the conductor and the first portion of the further conductor and removing any of the plurality of structures in the next fill pattern that are within the modified next level forbidden area; and
   if the first portion of the further conductor is within the first level forbidden area, further modifying the first level forbidden area to extend at least over the electrical component and the first portion of the conductor and the first portion of the further conductor and removing any of the plurality of structures in the fill pattern that are within the further modified first level forbidden area.

12. Computer readable media, having stored thereon, computer executable process steps operable to control a computer to perform the steps of:
   receiving or generating a first level frame including an electrical component;
   generating a fill pattern on the first level frame outside of a forbidden area of said first level frame, the fill pattern including a plurality of structures selected from the group consisting of fill structures, cheese structures and combinations thereof, wherein said first level forbidden area extends at least over the electrical component;
   generating a next level frame, the next level frame including the first level frame and a next level fill area outside of the first level frame, the first level framing having the fill pattern;
   adding a conductor to the next level frame, the conductor connected to the electrical component, a first portion of the conductor being in the first level frame and a second portion of the conductor being in the next level fill area;
   generating a next fill pattern on the next level fill area outside of a forbidden area of said next level fill area, the next fill pattern including a plurality of structures selected from the group consisting of fill structures, cheese structures and combinations thereof, wherein said next level forbidden area extends at least over the second portion of the conductor; and
   modifying the first level forbidden area to extend at least over the electrical component and the first portion of the conductor and removing any of the plurality of structures in the fill pattern that are within the modified first level forbidden area.

13. A tool for designing at least a portion of a circuit layout on a substrate, comprising a computer programmed to perform the steps of:
   receiving or generating a first level frame including an electrical component;

generating a fill pattern on the first level frame outside of a forbidden area of said first level frame, the fill pattern including a plurality of structures selected from the group consisting of fill structures, cheese structures and combinations thereof, wherein said first level forbidden area extends at least over the electrical component;

generating a next level frame, the next level frame including the first level frame and a next level fill area outside of the first level frame, the first level framing having the fill pattern;

adding a conductor to the next level frame, the conductor connected to the electrical component, a first portion of the conductor being in the first level frame and a second portion of the conductor being in the next level fill area;

generating a next fill pattern on the next level fill area outside of a forbidden area of said next level fill area, the next fill pattern including a plurality of structures selected from the group consisting of fill structures, cheese structures and combinations thereof, wherein said next level forbidden area extends at least over the second portion of the conductor; and modifying the first level forbidden area to extend at least over the electrical component and the first portion of the conductor and removing any of the plurality of structures in the fill pattern that are within the modified first level forbidden area.

* * * * *